United States Patent [19]

Murphy et al.

[11] Patent Number: 5,111,070
[45] Date of Patent: May 5, 1992

[54] DC INPUT CIRCUIT WITH CONTROLLED LEAKAGE CURRENT

[75] Inventors: Timothy J. Murphy, Hudson; Thaddeus A. Weber, Richmond Heights, both of Ohio

[73] Assignee: Allen-Bradley Company, Inc., Milwaukee, Wis.

[21] Appl. No.: 643,251

[22] Filed: Jan. 18, 1991

[51] Int. Cl.$^5$ .................... H03K 3/42; H03K 17/72
[52] U.S. Cl. ............................ 307/311; 307/318; 307/363; 307/571
[58] Field of Search ............ 307/350, 363, 318, 311, 307/571, 254, 362, 360, 302, 303.2, 580, 581

[56] References Cited

U.S. PATENT DOCUMENTS

| | | | |
|---|---|---|---|
| 4,027,235 | 5/1977 | Macrander et al. | 307/350 |
| 4,031,417 | 6/1977 | Wesner | 307/363 |
| 4,346,375 | 8/1982 | Billings | 307/350 |
| 4,507,571 | 3/1985 | Callan | 307/350 |
| 4,513,209 | 4/1985 | Tanabe et al. | 307/350 |
| 4,682,061 | 7/1987 | Donovan | 307/318 |
| 4,745,311 | 5/1988 | Iwasaki | 307/311 |
| 4,906,055 | 3/1990 | Horiuchi | 307/350 |

FOREIGN PATENT DOCUMENTS

2-48819  2/1990  Japan .................................. 307/311

Primary Examiner—Eugene R. LaRoche
Assistant Examiner—Tan Dinh
Attorney, Agent, or Firm—Quarles & Brady

[57] ABSTRACT

A DC input circuit provides a digital output dependent on an input voltage spanning a low range and a high range. A first transistor current source provides a bounded leakage current for a low range voltage. A parallel transistor current source in series with a voltage breakdown diode provides a second constant current path for high range voltages through a current sensitive switch. The total input current is thus limited, thereby reducing heat dissipation.

5 Claims, 2 Drawing Sheets

DC INPUT CIRCUIT WITH CONTROLLED LEAKAGE CURRENT

BACKGROUND OF THE INVENTION

1. Field of the Invention.

The field of the invention is digital switching circuits and in particular switching circuits for accepting DC signals for input to industrial controls and the like.

2. Background Art

Industrial controllers such as those described in U.S. Pat. Nos. 3,810,118, 3,942,158, 4,165,534 and 4,442,504 are typically connected to industrial equipment such as assembly lines or machine tools to operate processes or equipment in accordance with a stored program. In such industrial controllers the stored program includes instructions which, when executed, examine the condition of selected inputs to the controller from sensing devices on the controlled equipment and energize or de-energize selected outputs from the controller to operate devices on the controlled equipment.

The inputs to the controller may be discrete signals such as those from switches which may detect limits of process variables such as motion, temperature, time, or other quantities, or the inputs may be analog measures of the process variables themselves, which are generally then converted to digital binary form for processing.

The binary signals input to the industrial controller are typically generated by a switching device having two terminals wired in series with an external voltage source (typically, up to 32 volts) so that when the switching device is "closed", a first voltage in a high range is presented to the digital input and when the switching device is "opened" a second voltage in a low range (often equal to zero volts) is presented to the digital input.

The switching device may be a mechanical actuated pair of contacts or may be an electrically actuated relay or solid-state switch associated with active sensing circuitry. In this latter case, it is desirable that the active circuitry be powered from the same voltage source and through the same two terminals as is the relay or solid-state switch.

In order for the active circuitry of a switching device to receive power in either the opened or closed state, a small amount of current must flow through the switching device into the input of the industrial controller when the inputs are presented with either a high or low voltage from the switching device. This current is termed "leakage current" and is typically on the order of two milliamperes at a voltage in the low range of 5 volts under prevailing industrial standards.

One method of ensuring adequate leakage current into what may be otherwise a high impedance input to the controller is to shunt the input of the controller to ground with a resistor. For example, a 2.5 kΩ resistor shunting a high impedance input will ensure a 2 milliampere current flow at 5 volts with a power dissipation of 10 milliwatts.

Unfortunately, the current flowing through this shunting resistor will increase with the voltage at the controller's input, and for a voltage of 32 volts, within the high range, the power dissipated in this resistor will have increased nearly fifty times.

Often multiple input circuits will be located in a single I/O module of the industrial controller and many such I/O modules may be housed together in a rack. The heat dissipated cumulatively by many such modules employing a resistor to produce the leakage current would produce unacceptable cooling requirements.

SUMMARY OF THE INVENTION

The present invention is a DC input circuit which limits its maximum leakage current over a range of input voltages, ensuring adequate leakage current at low input voltages and reducing the power dissipated by high leakage currents at high input voltages.

Specifically, the DC input circuit includes a first controllable current source connected across its input terminals for conducting a first current at a first input voltage value in a low range and for limiting the first current flow to a first predetermined value for input voltages above a second input voltage value no less than the first input voltage value.

Connected together in series across the input terminals of the DC input circuit are also a current responsive switch for generating a first state of the digital output only in response to current flow through the current responsive switch; a second controllable current source connected in series with the current responsive switch for limiting the current though the current responsive switch to a second predetermined value; and a voltage threshold device for preventing the flow of current through the current responsive switch and the second controllable current source for input voltages not within a high range.

It is one object of the invention to provide a sufficient leakage current, for input voltages to the DC input circuit both in the high and low range, to power the active circuitry associated with the connected switching device. The first controllable current source is adjusted to provide an adequate amount of leakage current even for input voltages in the low range when no current is passed by the voltage threshold device.

It is another object of the invention to reduce the power dissipated by the DC input circuit at higher input voltages. The first controllable current source limits its current to a first predetermined value regardless of the input voltage. The second controllable current source limits the current conducted by the voltage threshold device. Thus, the total current flow into the DC input circuit is limited even for high input voltages reducing the power dissipated at those higher input voltages.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference must be made therefore to the claims herein for interpreting the scope of the invention.

DETAILED DESCRIPTION OF THE PREFERRED EMBODIMENT

Figure 1:
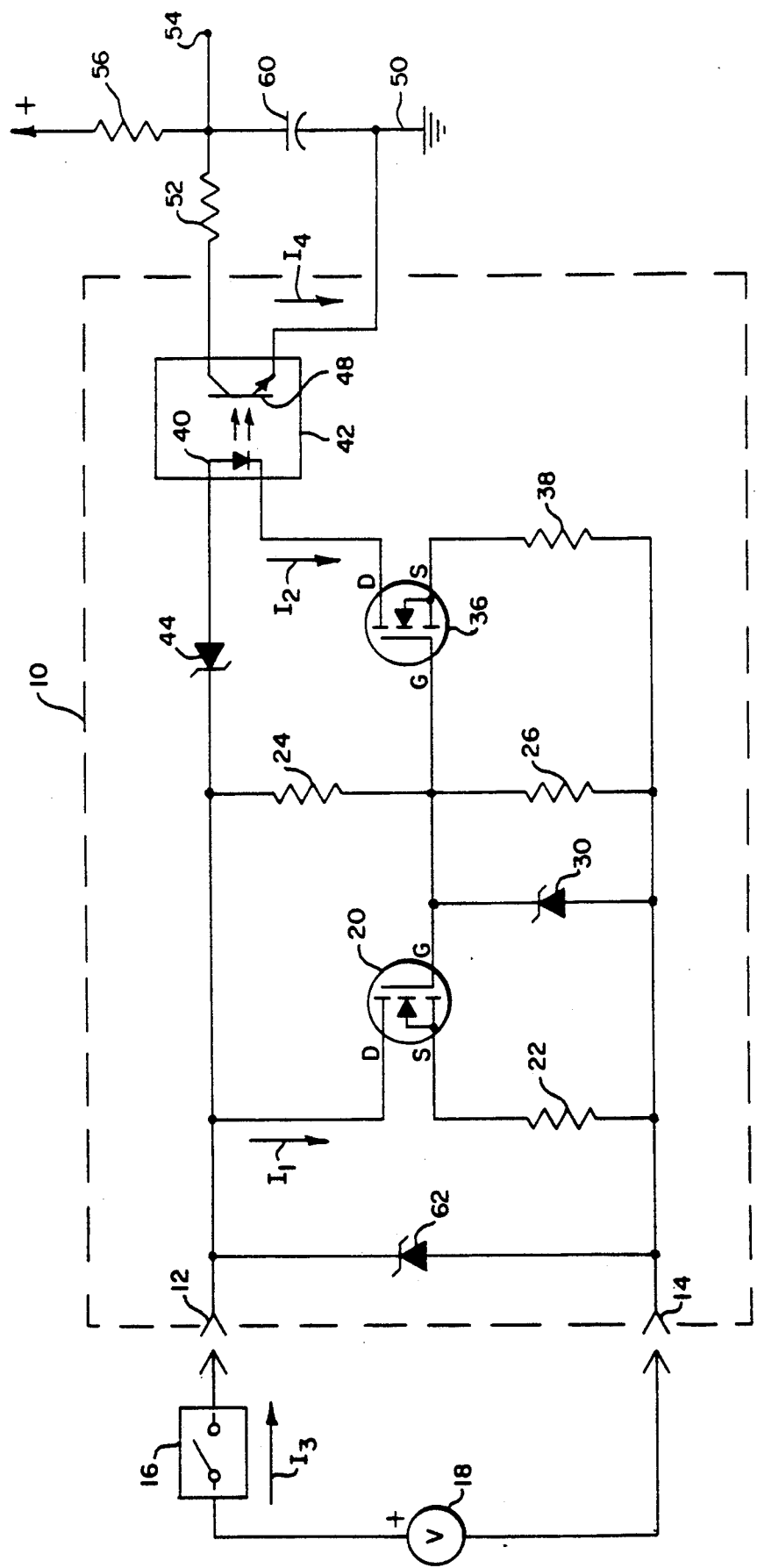
FIG. 1 is a schematic diagram of the DC input circuit of the present invention showing an external switching device attached to its input terminals and the connection of an external voltage source to the switching device.

Referring to FIG. 1 the DC input circuit of the present invention receives a voltage at input terminals 12 and 14 from one or more external switching devices 16 connected in series with an external voltage source 18. For convenience of discussion, terminal 14 is considered to be at ground potential and the voltages at the terminal 12 and current flows into and out of terminal 12 only will be described.

When the switching device 16 is in the "open" state, or nominally non-conducting, a voltage within a low voltage range will be present at the input terminal 12. If the switching device 16 is a simple mechanical switch, this voltage will be zero volts, however, if the switching device 16 includes active circuitry drawing power from the external voltage source 18, then this voltage will be somewhat above zero volts as a result of the passage of a small leakage current $I_3$ through the switching device 16 into the finite input impedance between the terminals 12 and 14 of the DC input circuit 10. This leakage current is necessary for the active switching device 16 to accept power from the external voltage source 18 when the switching device 16 is in the open state.

When the switching device 16 is in the "closed" state, or conducting, a second voltage within a high voltage range will be present at the input terminal 12. If the switching device 16 is a simple mechanical switch, this voltage will be substantially equal to the voltage of the external voltage source 18. If the switching device 16 includes active circuitry drawing power from the external voltage source 18, however, this voltage will be somewhat below the voltage of the external voltage source 18 as a result of the voltage drop across the switching device 16 necessary for the switching device 16 to accept power from the external voltage source 18.

In both the open and closed state of the switching device 16, the DC input circuit 10 accepts a leakage current $I_3$ to permit the use of switching devices 16 with active circuitry.

Figure 2:
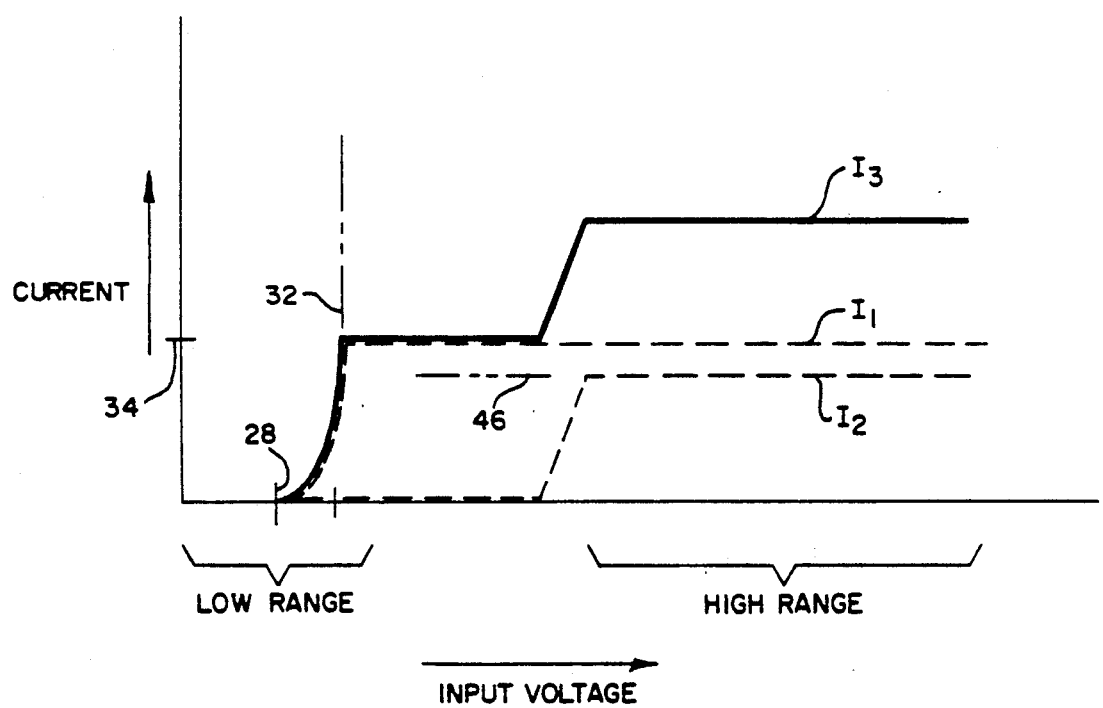
FIG. 2 is a chart of input current versus input voltage to the DC input circuit of FIG. 1.

Referring to FIGS. 1 and 2, when the voltage at input terminal 12 is in the low range, current $I_1$ is conducted through terminal 12 to the drain of a MOSFET 20 and from the source of MOSFET 20 through resistor 22 to terminal 14. The gate voltage of the MOSFET 20 is controlled by a voltage divider formed of resistors 24 and 26 connected in series between the input terminals 12 and 14 with the junction of resistors 24 and 26 connected to the gate of the MOSFET 20. The effect of this divider, for voltages in the low range, is to reduce the gate voltage of MOSFET 20 by approximately 5% beneath the voltage input to terminal 12.

The MOSFET 20 remains in a non-conducting state until its gate voltage exceeds a gate-to-source threshold voltage 28 typically on the order of a few volts and a function of the construction of the MOSFET 20. When the voltage at terminal 12 is sufficient to bias the gate of MOSFET 20 to a voltage above this gate-to-source threshold voltage 28, the MOSFET 20 begins to conduct current $I_2$ between its drain and source, the amount of current $I_2$ being predominantly a function of the value of resistor 22, the input voltage, and the gate-to-source threshold voltage 28 as is understood in the art. The gate-to-source threshold voltage 28 of MOSFET 20 and the resistance 22 are selected so that for at least one voltage in the low range, a predetermined minimum leakage current $I_1$, and hence $I_3$, can be ensured.

The voltage at the junction of resistors 24 and 26 biasing the gate of MOSFET 20 is limited by a zener diode 30 having its cathode attached to the junction and its anode attached to terminal 14. The breakdown voltage of zener diode 30 is selected to equal a first voltage threshold 32 above the gate-to-source threshold voltage 28 above which, the gate voltage of MOSFET 20 no longer tracks 95% of the input voltage at terminal 12 but is limited to the breakdown voltage of the zener diode 30. The effect of this limiting of the gate voltage is to limit the current flowing through the drain and source of MOSFET 20 at a first value 34.

In the preferred embodiment, this first current limit is approximately 2 milliampere and thus for voltages at input terminal 12 of up to 32 volts, the power dissipated by MOSFET 20 and resistor 22 is less than one tenth of a watt.

The junction of resistors 24 and 26 is also connected to the gate of a second MOSFET 36. The source of MOSFET 36 is connected through resistor 38 to the terminal 14 and the drain of MOSFET 36 is connected to the cathode of a light emitting diode (LED) 40 formed as part of an optical isolator 42. The anode of the LED 40 is connected to the anode of a second zener diode 44 and the cathode of zener diode 44 is connected to the terminal 12. Thus, zener diode 44, LED 40 and MOSFET 36 are in series across terminals 12 and 14.

The biasing of the gate of MOSFET 36 is identical to the biasing of the gate of MOSFET 20 and hence, but for the presence of zener diode 44, MOSFET 20 would conduct a constant current $I_2$ for any voltage above the first voltage threshold 32. The zener diode 44, however, prevents current flow $I_2$ for a range of voltages at input terminal 12 as will now be explained.

The breakdown voltage of zener diode 44 is above the highest voltage of the low range minus the forward voltage drop of the LED 40. Thus, when the voltage at terminal 12 is in the low range, no current $I_2$ is conducted by the zener diode 44 or the series connected LED 40 and MOSFET 36.

The breakdown voltage of zener diode 44 is selected to be below the lowest voltage of the high range minus the forward voltage drop of the LED 40. Thus, it will be ensured that for any voltage in the high range, the zener diode 44 will be conducting, given only the requirement that the lowest voltage of the high range be above the gate-to-source threshold voltage 28.

For voltages in the high range at terminal 12, when the zener diode 44 is first conducting, a small current $I_2$ will flow through the LED 40 and the MOSFET 36 and resistor 38. The gate of the MOSFET 36, however, will be at the first threshold voltage 32 resulting in a low drain-to-source resistance. As the voltage at terminal 12 increases further above the breakdown voltage of zener diode 44 the current $I_2$ through the zener diode 44 and series connected LED 40 and MOSFET 36 increases linearly as principally determined by resistor 38, until a second current limit 46 is reached. At this point the MOSFET 36 acts to limit further increases in current $I_2$. The second current limit is determined by the breakdown voltage of the zener diode 44, the gate-to-source threshold voltage of MOSFET 36 and the resistor 38 as is understood in the art. Further increase in the voltage at terminal 12 do not increase the current flow $I_2$.

The total leakage current $I_3$ is the sum of $I_1$ and $I_2$ through MOSFETs 20 and 36. The upper limit of $I_3$ is optimally the minimum required leakage current $I_3$ for a voltage in the low range plus the minimum current required to activate LED 40 for switching opto-isolator 42.

The LED 40 of the opto-isolator 42 is optically coupled to an NPN photo transistor 48 in opto-isolator 42 which conducts current in response to current $I_2$ through the LED 40 for all voltages in the high range. The emitter of transistor 48 is connected to an isolated ground 50 and the collector of transistor 48 collector is connected through resistor 52 to an isolated digital output 54. A pull-up resistor 56 is also connected to the isolated digital output 54 from isolated voltage source 58 and a noise reduction capacitor 60 shunts the isolated digital output 54 to the isolated ground 50 to provide low-pass filtering of possible noise induced transient conduction of the transistor 48. The isolated digital output 54 will be low or logically true when the voltage at terminal 12 is in the high range, and high or logically false when the voltage to the terminal 12 is in the low range.

The input terminals 12 and 14 are also shunted by a protection zener diode 62 having its cathode connected to terminal 12 and its anode connected to terminal 14 and having a breakdown voltage at the upper limit of the high range to protect the DC input circuit 10 against short duration voltage spikes.

Many modifications and variations of the preferred embodiment which will still be within the spirit and scope of the invention will be apparent to those with ordinary skill in the art. For example, other semiconductor devices may be used to realize the controlled currents sources created by MOSFETs 20 and 36. In order to apprise the public of the various embodiments that may fall within the scope of the invention, the following claims are made.

I claim:

1. A DC input circuit receiving an input voltage spanning a low range and a high range and producing a digital output having a first state when the input voltage is in the high range and a second state when the input voltage is in the low range, and for allowing an input leakage current with the input voltage, the input circuit comprising:

a pair of input terminals for receiving the input voltages and input leakage control;

a first controllable current source means connected across first and second terminals for conducting a first current at a first input voltage value in the low range, and holding the first current flow constant at a first non-zero predetermined value for all input voltages about a second input voltage value no less than the first input voltage value;

a current responsive switch for generating the first state of the digital output only in response to current flow through the current responsive switch;

a second controllable current source means connected in series with the current responsive switch for holding the current through the current responsive switch a second non-zero predetermined value; and a voltage threshold device in series with the current responsive switch and the second controllable current source, the series combination being connected across the first and second terminal, for preventing the flow of current through the current responsive switch and the second controllable current source for input voltages not within the high range.

2. The DC input circuit in claim 1 wherein the voltage threshold device is a first zener diode.

3. The DC input circuit of claim 1 wherein the current responsive switch is an opto-isolator.

4. The DC input circuit of claim 1 wherein the first and second controllable current sources are MOSFETs having their gate voltage clamped with respect to ground by a second zener diode.

5. The DC input circuit of claim 1 wherein the first state is a logical false and the second state is a logical true.

* * * * *

UNITED STATES PATENT AND TRADEMARK OFFICE
CERTIFICATE OF CORRECTION

PATENT NO. : 5,111,070

DATED : May 5, 1992

INVENTOR(S) : Murphy et al.

It is certified that error appears in the above-identified patent and that said Letters Patent is hereby corrected as shown below:

Col. 6, line 4,   "leakage control" should be -- leakage current --.

Col. 6, line 10,  "voltages about a second" should be -- voltages above a second --.

Signed and Sealed this

Tenth Day of August, 1993

Attest:

MICHAEL K. KIRK

*Attesting Officer*   Acting Commissioner of Patents and Trademarks